United States Patent [19]

Balasubramanian et al.

[11] Patent Number: 5,767,004
[45] Date of Patent: *Jun. 16, 1998

[54] METHOD FOR FORMING A LOW IMPURITY DIFFUSION POLYSILICON LAYER

[75] Inventors: Narayanan Balasubramanian; Ching Win Kong; Chuck Jang, all of Singapore, Singapore

[73] Assignee: Chartered Semiconductor Manufacturing, Ltd., Singapore, Singapore

[*] Notice: This patent issued on a continued prosecution application filed under 37 CFR 1.53(d), and is subject to the twenty year patent term provisions of 35 U.S.C. 154(a)(2).

[21] Appl. No.: 635,992

[22] Filed: Apr. 22, 1996

Related U.S. Application Data

[63] Continuation of Ser. No. 635,992, Apr. 22, 1996, abandoned.

[51] Int. Cl.⁶ .................................................. H01L 21/3205
[52] U.S. Cl. ........................ 438/592; 438/197; 438/301
[58] Field of Search .................... 437/40 GS, 41 GS, 437/247, 101; 438/592, 301, 197

[56] References Cited

U.S. PATENT DOCUMENTS

| | | | |
|---|---|---|---|
| 4,249,968 | 2/1981 | Gardiner et al. | 437/162 |
| 5,147,820 | 9/1992 | Chihipeddi et al. | 438/301 |
| 5,347,161 | 9/1994 | Wu et al. | 257/756 |
| 5,350,698 | 9/1994 | Huang et al. | 437/26 |
| 5,393,687 | 2/1995 | Liang | 437/46 |
| 5,422,311 | 6/1995 | Woo | 437/101 |
| 5,434,096 | 7/1995 | Chu et al. | 437/200 |
| 5,441,904 | 8/1995 | Kim et al. | 437/40 |
| 5,614,428 | 3/1997 | Kapoor | 438/592 |
| 5,652,156 | 7/1997 | Liao et al. | 438/592 |
| 5,712,181 | 1/1998 | Byun et al. | 438/592 |

FOREIGN PATENT DOCUMENTS 2224223  9/1990  Japan ................. 437/40 GS

*Primary Examiner*—Charles L. Bowers, Jr.
*Assistant Examiner*—Toniae M. Thomas
*Attorney, Agent, or Firm*—George O. Saile; Stephen B. Ackerman; Alek P. Szecsy

[57] ABSTRACT

A method for forming within an integrated circuit a low impurity diffusion polysilicon layer. Formed upon a semiconductor substrate is an amorphous silicon layer. Formed also upon the semiconductor substrate and contacting the amorphous silicon layer is a polysilicon layer. The amorphous silicon layer and the polysilicon layer are then simultaneously annealed to form a low impurity diffusion polysilicon layer. The low impurity diffusion polysilicon layer is a polysilicon multi-layer with grain boundary mis-matched polycrystalline properties. Optionally, a metal silicide layer may be formed upon the amorphous silicon layer and the polysilicon layer either prior to or subsequent to annealing the amorphous silicon layer and the polysilicon layer. The metal silicide layer and low impurity diffusion polysilicon layer may then be patterned to form a polycide gate electrode.

22 Claims, 1 Drawing Sheet

1

METHOD FOR FORMING A LOW IMPURITY DIFFUSION POLYSILICON LAYER

CROSS REFERENCE TO RELATED APPLICATION

This application is a file wrapper continuation application of application Ser. No. 08/635,992, filed 22 Apr. 1996, now abandoned.

BACKGROUND OF THE INVENTION

1. Field of the Invention

The present invention relates generally to polysilicon layers typically employed in forming polysilicon gate electrodes or polycide gate electrodes within Metal Oxide Semiconductor Field Effect Transistors (MOSFETs). More particularly the present invention relates to low impurity diffusion polysilicon layers typically employed in forming polysilicon gate electrodes or polycide gate electrodes within Metal Oxide Semiconductor Field Effect Transistors (MOSFETs).

2. Description of the Related Art

As integrated circuit technology has advanced and integrated circuit device and conductor element dimensions have decreased, it has become increasingly important to assure that advanced integrated circuit devices within advanced integrated circuits are fabricated in a filly functional and reliable fashion. Within advanced integrated circuits within which there are formed Metal Oxide Semiconductor Field Effect Transistors (MOSFETs) the functionality and reliability of the integrated circuits are often largely related to the functionality and reliability of the Metal Oxide Semiconductor Field Effect Transistors (MOSFETs) formed therein.

In that regard, within advanced Metal Oxide Semiconductor Field Effect Transistors (MOSFETs) which employ polysilicon or polycide (polysilicon/metal silicide stack) gate electrodes in contact with thin gate oxide layers, there is known in the art to occur functionality and reliability problems derived from the diffusion of dopant impurities and/or other impurities from the polysilicon or polycide gate electrode into and/or through the underlying thin gate oxide layer. For example, it is known that boron and/or phosphorus dopant impurities employed in doping polysilicon layers employed within polysilicon or polycide gate electrodes may diffuse from those polysilicon layers and through an underlying thin gate oxide layer, thus diffusing into a Metal Oxide Semiconductor Field Effect Transitor (MOSFET) channel region and compromising the Metal Oxide Semiconductor Field Effect Transistor (MOSFET) operating parameters. In addition, fluorine impurities from either: (1) boron difluoride impurity doping of a polysilicon layer within a polysilicon or polycide gate electrode; or (2) tungsten hexafluoride based Chemical Vapor Deposited (CVD) tungsten silicide employed in forming a tungsten silicide upper layer within a tungsten silicide polycide gate electrode may also diffuse through or from the polysilicon layer of a polysilicon or polycide gate electrode and cause an apparent increase in an underlying thin gate oxide layer thickness. Such an increase in thin gate oxide layer thickness may also compromise the operating parameters of a Metal Oxide Semiconductor Field Effect Transistor (MOSFET) within which is formed that polysilicon or polycide gate electrode.

In order to address the foregoing, and related, impurity diffusion based functionality and reliability problems, several methods have recently been disclosed in the art for forming low impurity diffusion polysilicon layers which may be employed within polysilicon or polycide gate electrodes within Metal Oxide Semiconductor Field Effect Transistors (MOSFETs). Some methods have also been shown to be useful within other integrated circuit devices or structures which are desirably formed of polysilicon layers having low impurity diffusion characteristics. In general, the low impurity diffusion polysilicon layers are formed from multiple adjoining polysilicon layers having grain boundary mismatched polycrystalline properties, thus presumably providing interfaces within the polysilicon layer, which interfaces impede impurity diffusion.

For example, Liang, in U.S. Pat. No. 5,393,687 discloses a method for forming a low impurity diffusion polysilicon layer used in contacting a shallow junction integrated circuit device electrode such as a shallow junction source/drain electrode. The low impurity diffusion polysilicon layer is formed through a two layer polysilicon deposition process employing an intervening cooling process step to provide two adjoining polysilicon layers with grain boundary mismatched polycrystalline properties. Through the method, diffusion of impurities from the upper polysilicon layer into the shallow junction integrated circuit device electrode is impeded.

In addition, Wu et al., in "Suppression of Boron Penetration into an Ultra-Thin Gate Oxide ($</=7$ nm) by Using a Stacked-Amorphous-Silicon (SAS) Film," 93 IEDM 329, and U.S. Pat. No 5,347,161 disclose related methods and structures for forming a low impurity diffusion polysilicon layer for a polysilicon gate electrode or a polysilicon emitter contacted junction diode. The low impurity diffusion polysilicon layer is formed through annealing a Stacked Amorphous Silicon (SAS) layer. The Stacked Amorphous Silicon (SAS) layer is formed from multiple amorphous silicon layers processed with intervening nitrogen backfill annealing process steps.

Further, Huang et al., in U.S. Pat. No. 5,350,698 also disclose a method for forming a low impurity diffusion polysilicon layer employed within a polysilicon gate electrode. The low impurity diffusion polysilicon layer is formed through annealing an intermediate multi-layer structure formed of multiple polysilicon layers interleaved with multiple silicon oxide layers.

Finally, there is disclosed by Kim et al., in U.S. Pat. No. 5,441,904 a method for forming a low impurity diffusion polysilicon layer employed within a tungsten silicide polycide gate electrode. The low impurity diffusion polysilicon layer is formed from multiple polysilicon layers formed with intervening annealing process steps. Preferably, the multiple polysilicon layers are also formed from different silicon source materials.

Desirable in the art are additional methods through which there may be formed within integrated circuits low impurity diffusion polysilicon layers which may be employed in forming polysilicon structures such as polysilicon gate electrodes or polycide gate electrodes within Metal Oxide Semiconductor Field Effect Transistors (MOSFETs). Particularly desirable are methods which: (1) do not require intervening annealing or cooling process steps; (2) do not require multiple silicon source materials; and (3) do not require interleaved silicon oxide layers, in forming low impurity diffusion polysilicon layers from polysilicon multi-layers with grain boundary mis-matched polycrystalline properties. Thus, most desirable in the art are methods through which low impurity diffusion polysilicon layers may be formed either in-situ in a single reactor chamber or in-situ in a multiple chamber cluster type tool with maximum manufacturing process simplicity and economy.

SUMMARY OF THE INVENTION

A first object of the present invention is to provide a method for forming a low impurity diffusion polysilicon layer within an integrated circuit.

A second object of the present invention is to provide a method in accord with the first object of the present invention, which method does not require intervening annealing or cooling process steps in forming the low impurity diffusion polysilicon layer from a polysilicon multi-layer with grain boundary mis-matched polycrystalline properties.

A third object of the present invention is to provide a method in accord with the first object of the present invention, which method does not require multiple silicon source materials in forming the low impurity diffusion polysilicon layer from a polysilicon multi-layer with grain boundary mismatched polycrystalline properties.

A fourth object of the present invention is to provide a method in accord with the first object of the present invention, which method also does not require interleaved silicon oxide layers in forming the low impurity diffusion polysilicon layer from a polysilicon multi-layer with grain boundary mis-matched polycrystalline properties.

A fifth object of the present invention is to provide a method in accord with the first object of the present invention, which method may be accomplished either in-situ in one reactor chamber or in-situ in a multiple chamber cluster tool.

A sixth object of the present invention is to provide a method in accord with the first object of the present invention, which method also provides for optimal manufacturing simplicity and economy.

In accord with the objects of the present invention, there is provided a method for forming within an integrated circuit a low impurity diffusion polysilicon layer. To form the low impurity diffusion polysilicon layer of the present invention, there is formed upon a semiconductor substrate an amorphous silicon layer. Formed also upon the semiconductor substrate in contact with the amorphous silicon layer is a polysilicon layer. Finally, the amorphous silicon layer and the polysilicon layer are simultaneously annealed until there is formed a polysilicon multi-layer with grain boundary mis-matched polycrystalline properties. Optionally, a metal silicide layer, such as a tungsten silicide layer, may be formed upon the amorphous silicon layer and the polysilicon layer either prior to or subsequently to annealing the amorphous silicon layer and the polysilicon layer. The layered stack of the metal silicide layer, the amorphous silicon layer (or annealed amorphous silicon layer) and the polysilicon layer (or annealed polysilicon layer) may then be patterned in the process of forming a polycide gate electrode for use within a Metal Oxide Semiconductor Field Effect Transistor (MOSFET).

The method of the present invention provides a low impurity diffusion polysilicon layer for use within an integrated circuit. In addition, the method through which is formed the low impurity diffusion polysilicon layer: (1) does not require intervening annealing or cooling process steps; (2) does not require multiple silicon source materials; and (3) does not require interleaved silicon oxide layers, in forming the low impurity diffusion polysilicon layer from a polysilicon multi-layer with grain boundary mis-matched polycrystalline properties. Although the low impurity diffusion polysilicon layer formed through the method of the present invention is a polysilicon multilayer formed with grain boundary mis-matched polycrystalline properties, the grain boundary mis-matched polycrystalline properties are achieved through forming an amorphous silicon layer in contact with a polysilicon layer and subsequently simultaneously annealing both the amorphous silicon layer and the polysilicon layer. The method of the present invention does not require intervening annealing or cooling process steps, multiple silicon source materials or interleaved silicon oxide layers in forming the polysilicon multi-layer with grain boundary mismatched polycrystalline properties.

The method of the present invention may be undertaken either in-situ in a single reactor chamber or in-situ in a multiple chamber cluster tool with optimal manufacturing simplicity and economy. Through the method of the present invention, both the amorphous silicon layer and the polysilicon layer which it contacts may be formed either in-situ in a single reactor chamber or in-situ in a multiple chamber cluster tool through an otherwise equivalent Low Pressure Chemical Vapor Deposition (LPCVD) method employing a single silicon source material by varying the Low Pressure Chemical Vapor Deposition (LPCVD) deposition temperature. At a lower Low Pressure Chemical Vapor Deposition (LPCVD) deposition temperature an amorphous silicon layer is formed, and at a higher Low Pressure Chemical Vapor Deposition (LPCVD) deposition temperature a polysilicon layer is formed. The amorphous silicon layer and the polysilicon layer may subsequently be simultaneously readily annealed in the same reactor chamber within which they are both formed. Thus, the method of the present invention may be undertaken either in-situ in a single reactor chamber or in-situ in a multiple chamber cluster tool with optimal manufacturing simplicity and economy.

DESCRIPTION OF THE PREFERRED EMBODIMENT

The present invention provides a method for forming within an integrated circuit a low impurity diffusion polysilicon layer. To form the low impurity diffusion polysilicon layer through the method of the present invention, there is formed upon a semiconductor substrate an amorphous silicon layer. Formed also upon the semiconductor substrate and contacting the amorphous silicon layer is a polysilicon layer. Finally, the amorphous silicon layer and the adjoining polysilicon layer are simultaneously annealed to form a polysilicon multi-layer with grain boundary mis-matched polycrystalline properties. The low impurity diffusion characteristics of the low impurity diffusion polysilicon layer formed through the method of the present invention derive from the grain boundary mis-matched polycrystalline properties of the polysilicon multi-layer formed from the annealed amorphous silicon layer and the adjoining annealed polysilicon layer.

Although the method of the present invention may be employed in forming within any integrated circuit a device or conductor element desirably formed employing a polysilicon layer with low impurity diffusion characteristics, the method of the present invention will typically be employed in forming within Metal Oxide Semiconductor Field Effect Transistors (MOSFETs) within integrated circuits polysilicon or polycide gate electrodes with low impurity diffusion characteristics. The method of the present invention may be employed in forming low impurity diffusion polysilicon or polycide gate electrodes within Metal Oxide Semiconductor Field Effect Transistors (MOSFETs) within integrated circuits including but not limited to Dynamic Random Access Memory (DRAM) integrated circuits, Static Random Access Memory (SRAM) integrated circuits and Application Specific Integrated Circuits (ASICs). The method of the present invention has broad applicability in forming within integrated circuits low impurity diffusion polysilicon layers from which may be formed polysilicon gate electrodes and polycide gate electrodes within Metal Oxide Semiconductor Field Effect Transistors (MOSFETs).

Figure 1:
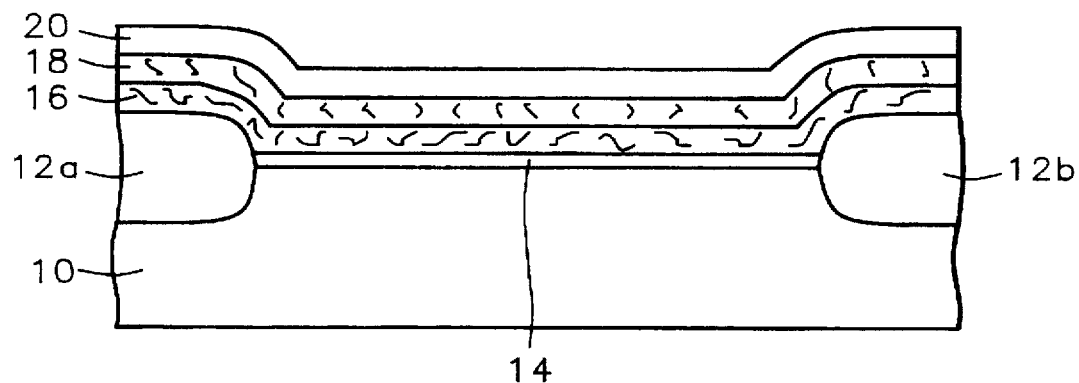
FIG. 1 to FIG. 3 show a series of schematic cross sectional diagrams illustrating the results of progressive process stages in forming within a Metal Oxide Semiconductor Field Effect Transistor (MOSFET) within an integrated circuit a polycide gate electrode which employs a low impurity diffusion polysilicon layer formed through the preferred embodiment of the method of the present invention.
Figure 2:
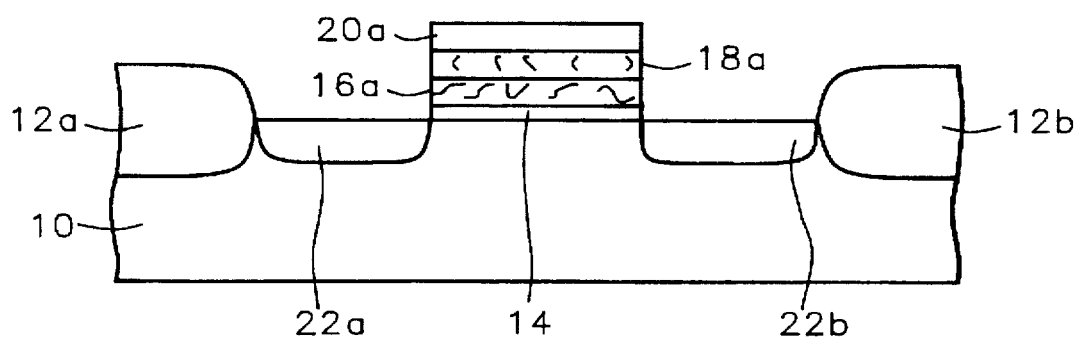
Figure 3:
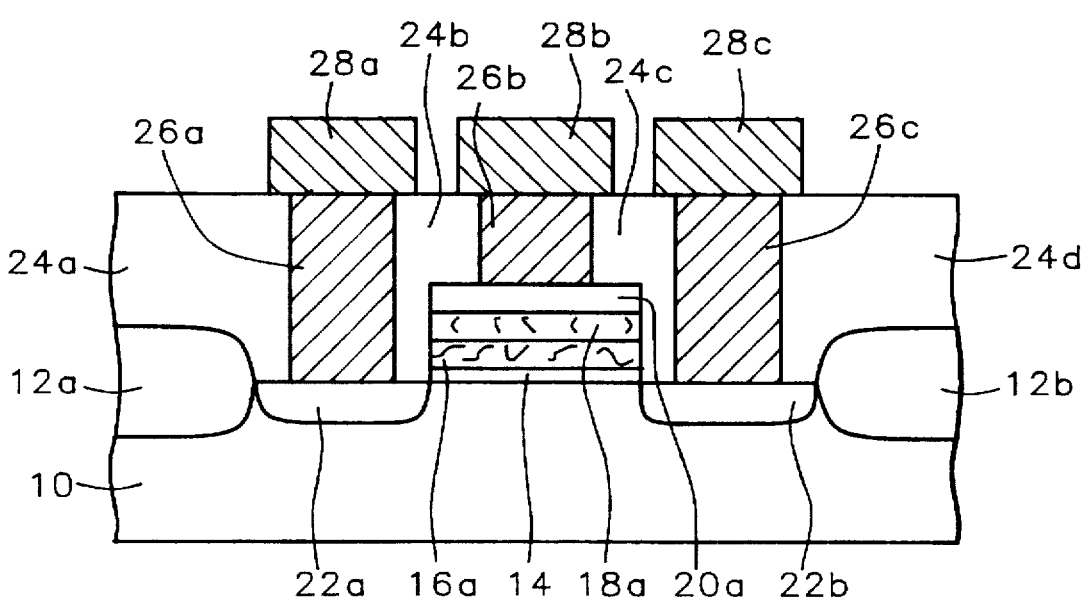

Referring now to FIG. 1 to FIG. 3, there is shown a series of schematic cross-sectional diagrams illustrating the results of progressive process steps in forming within a Metal Oxide Semiconductor Field Effect Transistor (MOSFET) within an integrated circuit a low impurity diffusion polycide gate electrode in accord with the preferred embodiment of the method of the present invention. Shown in FIG. 1 is a schematic cross-sectional diagram illustrating the result of early stages of processing of the integrated circuit.

Shown in FIG. 1 is a semiconductor substrate 10 within and upon whose surface is formed the isolation regions 12a and 12b which define the active region of the semiconductor substrate 10. Although the present invention may be practiced upon semiconductor substrates of either dopant polarity, various dopant concentrations and various crystallographic orientations, the semiconductor substrate 10 upon which is practiced the preferred embodiment of the method of the present invention is preferably a (100) silicon semiconductor substrate having an N- or P- doping.

Methods and materials through which isolation regions may be formed within and/or upon semiconductor substrates are known in the art of integrated circuit manufacture. Isolation regions may be formed within and/or upon semiconductor substrates through methods including but not limited to thermal oxidation methods whereby portions of a semiconductor substrate exposed through a suitable mask are oxidized to form isolation regions within and upon the semiconductor substrate, and isolation region deposition methods whereby blanket layers of suitable insulator materials are deposited upon a semiconductor substrate and patterned to form isolation regions upon the semiconductor substrate. For the preferred embodiment of the method of the present invention, the isolation regions 12a and 12b are preferably formed through a thermal oxidation method whereby portions of the semiconductor substrate 10 exposed through a suitable mask are oxidized at a temperature of from about 900 to about 1100 degrees centigrade to form isolation regions 12a and 12b of silicon oxide within and upon the semiconductor substrate 10.

Also shown in FIG. 1 is the presence of a blanket gate oxide layer 14 which is formed upon the active region of the semiconductor substrate 10 defined by the isolation regions 12a and 12b. Methods and materials through which blanket gate oxide layers may be formed upon active regions of semiconductor substrates are known in the art of integrated circuit manufacture. Blanket gate oxide layers may be formed upon active regions of semiconductor substrates through methods including but not limited to thermal oxidation methods whereby the active region of a semiconductor substrate is oxidized to form a blanket gate oxide layer upon the active region of the semiconductor substrate and blanket gate oxide layer deposition methods whereby blanket gate oxide layers are independently deposited upon a portion of a semiconductor substrate including the active region of the semiconductor substrate. For the preferred embodiment of the method of the present invention, the blanket gate oxide layer 14 is preferably formed through thermal oxidation of the active region of the semiconductor substrate at a temperature of from about 800 to about 900 degrees centigrade to form the blanket gate oxide layer 14 of thickness from about 60 to about 200 angstroms.

Also shown in FIG. 1 is the presence of a blanket amorphous silicon layer 16 which resides beneath a blanket polysilicon layer 18. The blanket amorphous silicon layer 16 and the blanket polysilicon layer 18, when annealed, form the low impurity diffusion polysilicon layer formed through the method of the present invention. Although there are several methods and materials through which may be formed blanket amorphous silicon layers and blanket polysilicon layers within integrated circuits, including but not limited to Chemical Vapor Deposition (CVD) methods, Low Pressure Chemical Vapor Deposition (LPCVD) methods and Physical Vapor Deposition (PVD) sputtering methods, both the amorphous silicon layer 16 and the polysilicon layer 18 formed through the preferred embodiment of the method of the present invention are preferably formed through a Low Pressure Chemical Vapor Deposition (LPCVD) method. Other methods may, however, be employed provided that there may be sequentially formed through those methods an amorphous silicon layer and a polysilicon layer.

The preferred embodiment of the method of the present invention provides manufacturing simplicity and economy in forming a low impurity diffusion polysilicon layer when the blanket amorphous silicon layer 16 and the blanket polysilicon layer 18 are formed from the same silicon source material. Thus, the silicon source material employed within the Low Pressure Chemical Vapor Deposition (LPCVD) deposition method of the preferred embodiment of the method of the present invention is preferably silane, although other silicon source materials, such as but not limited to disilane and dichlorosilane may also be employed in forming the blanket amorphous silicon layer 16 and the blanket polysilicon layer 18. In order to form the blanket amorphous silicon layer 16 and the blanket polysilicon layer 18 through the same Low Pressure Chemical Vapor Deposition (LPCVD) method in-situ in the same reactor chamber from the same silicon source material, the deposition temperate of the Low Pressure Chemical Vapor Deposition (LPCVD) method is varied. Thus, for the preferred embodiment of the method of the present invention, the blanket amorphous silicon layer 16 is preferably formed at a Low Pressure Chemical Vapor Deposition (LPCVD) deposition temperature of from about 500 to about 580 degrees centigrade and the blanket polysilicon layer 16 is preferably formed at a Low Pressure Chemical Vapor Deposition (LPCVD) deposition temperature of from about 600 to about 700 degrees centigrade. Preferably, the blanket amorphous silicon layer 16 is from about 400 to about 700 angstroms thick, and the blanket polysilicon layer 18 is from about 1000 to about 1500 angstroms thick. Other parameters under which are preferably formed the blanket amorphous silicon layer 16 and the blanket polysilicon layer 18 include a reactor chamber pressure of from about 0.15 to about 0.3 torr and a silane silicon source gas flow of from about 100 to about 500 standard cubic centimeters per minute (sccm).

As is understood by a person skilled in the art, the method of the present invention will also provide a functional low impurity diffusion polysilicon multi-layer with grain boundary mis-matched polycrystalline properties when the order in which the blanket amorphous silicon layer 16 and the blanket polysilicon layer 18 are formed upon the surface of the semiconductor substrate 10 is reversed. Although a reverse ordering will provide a functional low impurity diffusion polysilicon layer, a reverse ordering is typically not preferred since manufacturing simplicity and economy are more readily achieved when there is a progression in temperature in forming the blanket amorphous silicon layer 16 at the relatively lower temperature of from about 500 to about 580 degrees centigrade followed by forming the blanket polysilicon 18 at the relatively higher temperature of about 600 to about 700 degrees centigrade.

As is also understood by a person skilled in the art, both the blanket amorphous silicon layer 16 and the blanket polysilicon layer 18 are preferably made conductive through doping in order for the low impurity diffusion polysilicon layer which is formed from those two layers to serve adequately as a polysilicon layer within a polysilicon or polycide gate electrode within a Metal Oxide Semiconductor Field Effect Transistor (MOSFET). Several methods may be employed in introducing sufficient quantities of dopants into the blanket amorphous silicon layer 16 and the blanket polysilicon layer 18 to make the low diffusion impurity polysilicon layer formed from those two layers sufficiently conductive to serve as a polysilicon layer within a polysilicon gate electrode or a polycide gate electrode within a Metal Oxide Semiconductor Field Effect Transistor (MOSFET). These methods include but are not limited to co-deposition methods where suitable dopants are incorporated as the blanket amorphous silicon layer 16 and the blanket polysilicon layer 18 are formed, and ion implantation methods where a suitable quantity of dopant is implanted into the blanket polysilicon layer 18 after the blanket amorphous silicon layer 16 and the blanket polysilicon layer 18 are formed. Arsenic dopants, boron dopants and phosphorus dopants are common in the art. For the preferred embodiment of the method of the present invention, the blanket amorphous silicon layer 16 and the blanket polysilicon layer 18 are preferably doped with a suitable dopant through an ion implantation method at an ion implantation dose of from about 1E15 to about 2E16 ions per square centimeter and an ion implantation energy of from about 20 to about 50 keV. Under such conditions, a dopant concentration of at least about 1E19 dopant atoms per cubic centimeter is typically and preferably formed within the blanket amorphous silicon layer 16 and the blanket polysilicon layer 18 or the low impurity diffusion polysilicon layer which is formed through simultaneously annealing those two layers.

Finally, there is shown in FIG. 1 the presence of a blanket metal silicide layer 20 formed upon the surface of the blanket polysilicon layer 18. Methods and materials through which blanket metal silicide layers may be formed within integrated circuits are known in the art of integrated circuit manufacture. As is known in the art, blanket metal silicide layers may be formed from metal silicide forming metals including but not limited to tungsten, titanium, platinum, cobalt and tantalum. In addition, the blanket metal silicide layers may be formed through methods including but not limited to Chemical Vapor Deposition (CVD) methods, Physical Vapor Deposition (PVD) sputtering methods and selective thermal annealing methods employing blanket metal silicide forming metal layers formed upon blanket silicon layers. Although other methods and materials may also be employed in forming the blanket metal silicide layer 20, for the preferred embodiment of the method of the present invention, the blanket metal silicide layer 20 is preferably formed of tungsten silicide deposited through a Chemical Vapor Deposition (CVD) method employing tungsten hexafluoride as a tungsten source material. Preferably, the blanket metal silicide layer is from about 1000 to about 1700 angstroms thick.

Although not specifically illustrated in FIG. 1, in order to form the low impurity diffusion polysilicon layer through the preferred embodiment of the method of the present invention, the blanket amorphous silicon layer 16 and the blanket polysilicon layer 18 (or subsequently patterned portions of those two layers) are simultaneously annealed. The processing point in the preferred embodiment of the method of the present at which the blanket amorphous silicon layer 16 and the blanket polysilicon layer 18 are simultaneously annealed is typically not critical. The blanket amorphous silicon layer 16 and the blanket polysilicon layer 18 may be simultaneously annealed immediately after both layers are formed upon the semiconductor substrate 10, immediately after the optional blanket metal silicide layer 20 is formed upon the blanket amorphous silicon layer 16 and the blanket polysilicon layer 18 or at some other appropriate time in the processing of the integrated circuit whose schematic cross-sectional diagram is illustrated by FIG. 1 to FIG. 3. For the preferred embodiment of the method of the present invention, patterned portions of the blanket amorphous silicon layer 16 and the blanket polysilicon layer 18 are preferably annealed simultaneously with another annealing process typically employed in forming the integrated circuit whose schematic cross-sectional diagram is illustrated in FIG. 1 to FIG. 3. The other annealing process may include, but are not limited to, source/drain electrode ion implant annealing processes. Preferably the simultaneous annealing is undertaken through a conventional thermal method at a temperature of from about 800 to about 950 degrees centigrade for a time period of from about 15 to about 45 minutes. Alternatively, more advanced thermal annealing methods, such as but not limited to Rapid Thermal Processing (RTP) annealing methods at a temperature of from about 800 to about 1000 degrees centigrade for a time period of from about 30 to about 60 seconds may also be employed.

Referring now to FIG. 2, there is shown a schematic cross-sectional diagram illustrating the results of further processing of the integrated circuit whose schematic cross-sectional diagram is illustrated in FIG. 1. Shown in FIG. 2 is the presence of a gate oxide layer 14a upon which is aligned a patterned amorphous silicon layer 16a, a patterned polysilicon layer 18a and a patterned metal silicide layer 20a. The patterned amorphous silicon layer 16a, the patterned polysilicon layer 18a and the patterned metal silicide layer 20a, when annealed, form a polycide gate electrode employed within a Metal Oxide Semiconductor Field Effect Transistor (MOSFET) formed through the preferred embodiment of the method of the present invention. The four patterned layers are patterned from their corresponding blanket layers, as illustrated in FIG. 1, through methods as are conventional in the art. Typically, although not exclusively, the patterning is accomplished through a Reactive Ion Etch (RIE) plasma etch method employing a patterned photo resist layer, where the patterned photoresist layer and/or upper lying patterned layers serve as masks for patterning the lower lying patterned layers from their corresponding blanket layers.

Also shown in FIG. 2 is the presence of the source/drain electrodes 22a and 22b formed into the active region of the semiconductor substrate 10 at areas not occupied by the patterned layers which form the polycide gate electrode. Methods and materials through which source/drain electrodes may be formed within active regions of semiconductor substrates adjoining polycide gate electrodes are known within the art of integrated circuit manufacture. Source/drain electrodes are typically, although not exclusively formed through implanting in a self aligned fashion a suitable dopant into the active region of the semiconductor substrate at a dose and energy sufficient to form source/drain electrodes into the active region of the semiconductor substrate. Arsenic dopants, boron dopants and phosphorus dopants are common in the art of forming source/drain electrodes. For the preferred embodiment of the method of the present invention, the source/drain electrodes 22a and 22b are preferably formed through implanting in a self-aligned fashion employing the patterned layers which form the polycide gate electrode as a mask a suitable dopant into the active region of the semiconductor substrate 10 at an ion implantation dose of from about 1E15 to about 1E16 ions per square centimeter and an ion implantation energy of from about 50 to about 90 keV. As is understood by a person skilled in the art, it is common in the art of forming source/drain electrodes within a semiconductor substrate through an ion implantation process that the semiconductor substrate will typically subsequently be annealed in order to repair damage to the region of the semiconductor substrate into which is formed the source/drain electrodes through the ion implantation process. Thus, for the preferred embodiment of the method of the present invention, the annealing of the patterned amorphous silicon layer 16a and the patterned polysilicon layer 18a to form the low impurity diffusion polysilicon layer within the polycide gate electrode is preferably undertaken, at the conditions as noted above, simultaneously with the annealing to repair the damage to the semiconductor substrate 10 in forming the source/drain electrodes 22a and 22b.

Referring now to FIG. 3, there is shown a schematic cross-sectional diagram illustrating the results of further processing of the integrated circuit whose schematic cross-sectional diagram is illustrated in FIG. 2. Shown in FIG. 3 is the presence of a series of patterned planarized Pre-Metal Dielectric (PMD) layers 24a, 24b, 24c and 24d formed upon the surface of the integrated circuit whose schematic cross-sectional diagram is illustrated in FIG. 2. Methods and materials through which patterned planarized Pre-Metal Dielectric (PMD) layers may be formed within integrated circuits are known within the art of integrated circuits manufacture. Patterned planarized Pre-Metal Dielectric (PMD) layers are typically, although not exclusively, formed through patterning through methods as are conventional in the art of planarized Pre-Metal Dielectric (PMD) layers. In turn, planarized Pre-Metal Dielectric (PMD) layers are typically formed through planarizing through methods are conventional in the art of conformal Pre-Metal Dielectric (PMD) layers. The planarizing methods include but are not limited to Chemical Mechanical Polish (CMP) planarizing methods and Reactive Ion Etch (RIE) etch-back planarizing methods. Finally, as is known in the art, conformal Pre-Metal Dielectric (PMD) layers may be formed of dielectric materials including but not limited to silicon oxide dielectric materials, silicon nitride dielectric materials and silicon oxynitride dielectric materials formed upon semiconductor substrates through deposition methods including but not limited to Chemical Vapor Deposition (CVD) methods, Plasma Enhanced Chemical Vapor Deposition (PECVD) methods and Physical Vapor Deposition (PVD) sputtering methods.

For the preferred embodiment of the method of the present invention, the patterned planarized Pre-Metal Dielectric (PMD) layers 24a, 24b, 24c and 24d are preferable: (1) formed of a silicon oxide dielectric material deposited through a Plasma Enhanced Chemical Vapor Deposition (PECVD) method; (2) planarized through a Chemical Mechanical Polish (CMP) planarizing method; and (3) patterned through an anisotropic Reactive Ion Etch (RIE) etch method as is conventional in the art. Preferably the patterned planarized Pre-Metal Dielectric (PMD) layers 24a, 24b, 24c and 24d are from about 8000 to about 12000 angstroms thick each. Preferably, the apertures between the patterned planarized Pre-Metal Dielectric (PMD) layers 24a, 24b, 24c and 24d are etched sufficiently deeply to reach the surfaces of the source/drain electrode 22a, the patterned metal silicide layer 20a and the source/drain electrode 22b.

Also shown in FIG. 3 is the presence of the conductive contact studs 26a, 26b and 26c formed into the apertures between the patterned planarized Pre-Metal Dielectric (PMD) layers 24a, 24b, 24c and 24d. Methods and materials through which conductive contact studs may be formed within patterned planarized Pre-Metal Dielectric (PMD) layers within integrated circuit are also known in the art of integrated circuit fabrication. Conductive contact studs may be formed through methods including but not limited to thermally assisted evaporation methods, electron beam assisted evaporation methods, Chemical Vapor Deposition (CVD) methods and Physical Vapor Deposition (PVD) sputtering methods through which may be formed conductive contact studs of conductive materials including but not limited to metals, metal alloys and highly doped polysilicon. For the preferred embodiment of the method of the present invention, the conductive contact studs 26a, 26b and 26c are preferably formed of tungsten metal formed through a Chemical Vapor Deposition (CVD) method, as is common in the art. The conductive contact studs 26a, 26b and 26c are preferably formed of a thickness sufficient to reach the upper surfaces of the patterned Pre-Metal Dielectric (PMD) layers 24a, 24b, 24c and 24d.

Finally, there is shown in FIG. 3 the presence of patterned first conductor layers 28a, 28b and 28c formed to make contact with the corresponding conductive contact studs 26a, 26b and 26c. Methods and materials through which patterned conductor layers may be formed within integrated circuits are known in the art of integrated circuit manufacture. Patterned conductor layers are typically, although not exclusively formed through patterning through methods as are conventional in the art of blanket conductor layers. Blanket conductor layers may be formed through methods including but not limited to thermally assisted evaporation methods, electron beam assisted evaporation methods, Chemical Vapor Deposition (CVD) methods and Physical Vapor Deposition (PVD) sputtering methods through which may be formed blanket conductor layers of conductor materials including but not limited to aluminum, aluminum alloys and copper.

For the preferred embodiment of the method of the present invention, the patterned first conductor layers 28a, 28b and 28c are preferably formed through patterning through methods as are conventional in the art of a blanket first conductor layer formed at least in part of aluminum or an aluminum alloy, as is common in the art.

Upon forming the patterned first conductor layers 28a, 28b and 28c, there is formed a Metal Oxide Semiconductor Field Effect Transistor (MOSFET) within an integrated circuit. The Metal Oxide Semiconductor Field Effect Transistor (MOSFET) has formed therein a polycide gate electrode which employs a low impurity diffusion polysilicon layer formed through the preferred embodiment of the method of the present invention. The low impurity diffusion polysilicon layer is formed through annealing an amorphous silicon layer which contacts a polysilicon layer. Through this method there is formed a low impurity diffusion polysilicon multi-layer with grain boundary mis-matched polycrystalline properties. In comparison with alternative methods for forming a low impurity diffusion polysilicon layer through a polysilicon multi-layer with grain boundary mis-matched polycrystalline properties, the method of the present invention does not employ intervening annealing or cooling process steps, multiple silicon source materials or interleaved silicon oxide layers. The low impurity diffusion polysilicon layer formed through the method of the present invention may be formed either in-situ in a single reactor chamber or in-situ in a multiple chamber cluster tool with maximum manufacturing process simplicity and economy.

As is understood by a person skilled in the art, revisions may be made to methods, materials, structures and dimensions through which is formed the low impurity diffusion polysilicon multi-layer with grain boundary mis-matched polycrystalline properties of the preferred embodiment of the method of the present invention while still forming a low impurity diffusion polysilicon multi-layer with grain boundary mis-matched polycrystalline properties within the spirit and scope of the present invention, as defined by the following claims.

What is claimed is:

1. A method for forming an impurity diffusion inhibited polysilicon layer comprising:

forming over a semiconductor substrate an amorphous silicon layer;

forming over the semiconductor substrate a polysilicon layer in contact with the amorphous silicon layer;

annealing simultaneously the amorphous silicon layer and the polysilicon layer to form an impurity diffusion inhibited polysilicon layer, the impurity diffusion inhibited polysilicon layer being a polysilicon multi-layer with grain boundary mis-matched polycrystalline properties; and forming adjoining the impurity diffusion inhibited polysilicon layer a metal silicide layer, the impurity diffusion inhibited polysilicon layer inhibiting diffusion of impurities from within the impurity diffusion inhibited polysilicon layer and the impurity diffusion inhibited polysilicon layer inhibiting diffusion of impurities through the impurity diffusion inhibited polysilicon layer from the metal silicide layer.

2. The method of claim 1 wherein the amorphous silicon layer is from about 400 to about 700 angstroms thick.

3. The method of claim 1 wherein the amorphous silicon layer is formed through a Low Pressure Chemical Vapor Deposition (LPCVD) method employing silicone as a silicon source material.

4. The method of claim 3 wherein the Low Pressure Chemical Vapor Deposition (LPVCD) method is undertaken at a deposition temperature of from about 500 to about 580 degrees centigrade.

5. The method of claim 1 wherein the polysilicon layer is from about 1000 to about 1500 angstroms thick.

6. The method of claim 1 wherein the polysilicon layer is formed through a Low Pressure Chemical Vapor Deposition (LPCVD) method employing silicone as a silicon source material.

7. The method of claim 6 wherein the Low Pressure Chemical Vapor Deposition (LPCVD) method is undertaken at a deposition temperature of from about 600 to about 700 degrees centigrade.

8. The method of claim 1 wherein the amorphous silicon layer and the polysilicon layer are simultaneously thermally annealed through a conventional thermal method at a temperature of from about 800 to about 950 degrees centigrade for a time period of from about 15 to about 45 minutes.

9. The method of claim 1 wherein the amorphous silicon layer is formed over the semiconductor substrate prior to forming the polysilicon layer over the semiconductor substrate.

10. The method of claim 1 wherein the polysilicon layer is formed over the semiconductor substrate prior to forming the amorphous silicon layer over the semiconductor substrate.

11. A method for forming an impurity diffusion inhibited polycide gate electrode for use within a Metal Oxide Semiconductor Field Effect Transistor (MOSFET) comprising:

forming over a semiconductor substrate an amorphous silicon layer;

forming over the semiconductor substrate a polysilicon layer contacting the amorphous silicon layer;

annealing simultaneously the amorphous silicon layer and the polysilicon layer to form an impurity diffusion inhibited polysilicon layer, the impurity diffusion inhibited polysilicon layer being a polysilicon multi-layer having grain boundary mis-matched polycrystalline properties;

forming contacting the impurity diffusion inhibited polysilicon layer a metal silicide layer, the impurity diffusion inhibited polysilicon layer inhibiting diffusion of impurities from within the impurity diffusion inhibited polysilicon layer and the impurity diffusion inhibited polysilicon layer inhibiting diffusion of impurities through the impurity diffusion inhibited polysilicon layer from the metal silicide layer; and patterning the metal silicide layer and the impurity diffusion inhibited polysilicon layer to form a polycide gate electrode.

12. The method of claim 11 wherein the amorphous silicon layer is from about 400 to about 700 angstroms thick.

13. The method of claim 11 wherein the amorphous silicon layer is formed through a Low Pressure Chemical Vapor Deposition (LPCVD) method employing silicone as a silane source material.

14. The method of claim 13 wherein the Low Pressure Chemical Vapor Deposition (LPCVD) method is undertaken at a deposition temperature of from about 500 to about 580 degrees centigrade.

15. The method of claim 11 wherein the polysilicon layer is from about 1000 to about 1500 angstroms thick.

16. The method of claim 11 wherein the polysilicon layer is formed through a Low Pressure Chemical Vapor Deposition (LPCVD) method employing silicone as a silane source material.

17. The method of claim 16 wherein the Low Pressure Chemical Vapor Deposition (LPCVD) method is undertaken at a deposition temperature of from about 600 to about 700 degrees centigrade.

18. The method of claim 11 wherein the amorphous silicon layer and the polysilicon layer are thermally annealed through a conventional thermal method at a temperature of from about 800 to about 950 degrees centigrade for a time period of from about 15 to about 45 minutes.

19. The method of claim 11 wherein the amorphous silicon layer is formed over the semiconductor substrate prior to forming the polysilicon layer over the semiconductor substrate.

20. The method of claim 11 wherein the metal silicide layer is a tungsten silicide layer.

21. The method of claim 20 wherein the tungsten silicide is formed through a Chemical Vapor Deposition (CVD) method employing tungsten hexafluoride as a tungsten source material.

22. The method of claim 1 wherein the metal silicide layer the is a tungsten silicide layer formed through a Chemical Vapor Deposition (CVD) method employing tungsten hexafluoride as a tungsten source material.

* * * * *